United States Patent
Ikeda et al.

(10) Patent No.: US 10,991,549 B2
(45) Date of Patent: Apr. 27, 2021

(54) ANTENNA AND PLASMA DEPOSITION APPARATUS

(71) Applicant: Tokyo Electron Limited, Tokyo (JP)

(72) Inventors: Taro Ikeda, Yamanashi (JP); Toshihiko Iwao, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 16/213,042

(22) Filed: Dec. 7, 2018

(65) Prior Publication Data

US 2019/0180984 A1 Jun. 13, 2019

(30) Foreign Application Priority Data

Dec. 12, 2017 (JP) .............................. JP2017-237917

(51) Int. Cl.
    *H01J 37/32* (2006.01)
    *C23C 16/455* (2006.01)
    *C23C 16/50* (2006.01)

(52) U.S. Cl.
    CPC .. *H01J 37/32082* (2013.01); *C23C 16/45565* (2013.01); *C23C 16/50* (2013.01); *H01J 37/3244* (2013.01); *H01J 2237/332* (2013.01)

(58) Field of Classification Search
    USPC ... 118/723 MW, 723 ME, 723 AN, 723 MR; 156/345.35, 345.41, 345.42
    See application file for complete search history.

(56) References Cited

U.S. PATENT DOCUMENTS

| | | | | |
|---|---|---|---|---|
| 2011/0018651 A1* | 1/2011 | Ikeda | ......................... | H01P 5/12 |
| | | | | 333/118 |
| 2012/0034136 A1* | 2/2012 | Collins | .................... | H05H 1/46 |
| | | | | 422/186.29 |
| 2012/0090782 A1* | 4/2012 | Ikeda | ....................... | H05H 1/46 |
| | | | | 156/345.28 |
| 2012/0299671 A1* | 11/2012 | Ikeda | ................. | H01Q 15/0006 |
| | | | | 333/248 |
| 2016/0196955 A1* | 7/2016 | Stowell | ................. | H01Q 13/22 |
| | | | | 156/345.41 |

FOREIGN PATENT DOCUMENTS

| | | |
|---|---|---|
| JP | 2009-230915 | 10/2009 |
| JP | 2011-166740 | 8/2011 |
| JP | 2012-216525 | 11/2012 |
| JP | 2017-005345 | 1/2017 |

* cited by examiner

*Primary Examiner* — Rakesh K Dhingra
(74) *Attorney, Agent, or Firm* — IPUSA, PLLC

(57) ABSTRACT

An antenna includes a first waveguide configured to guide VHF radio frequency waves, and a second waveguide configured to guide the VHF radio frequency waves supplied from the first waveguide, the second waveguide having a pair of metal reflective plates therein facing each other across a longitudinal distance along the second waveguide, wherein a tip end of the first waveguide is coupled to the second waveguide at a sideways point thereof between the metal reflective plates, and wherein a distance between the metal reflective plates is $\lambda g/4 + \lambda g \cdot n/2$, $\lambda g$ being a wavelength of the VHF radio frequency waves in tube, and n being an integer greater than or equal to zero.

11 Claims, 4 Drawing Sheets

ANTENNA AND PLASMA DEPOSITION APPARATUS

BACKGROUND OF THE INVENTION

1. Field of the Invention

The disclosures herein relate to an antenna and a plasma deposition apparatus.

2. Description of the Related Art

Plasma deposition apparatuses and plasma generating antennas capable of supplying gases and micro waves have been known in the art (see Patent Documents 1 through 4, for example).

Plasma treatment may be performed by utilizing VHF (very high frequency) electromagnetic waves having frequencies lower than those of microwaves but higher than those of LF (low frequency) and HF (high frequency) bands. VHF is in a range of approximately 60 MHz to 300 MHz, which is higher in frequency than a range of approximately 0.45 MHz to 13 MHz for LF and a range of approximately 40 MHz to 60 MHz for HF. Plasma generated by using VHF radio frequency power thus has higher plasma density than the plasma generated by radio frequency power having lower frequencies, thereby being capable of causing ions and electrons in the plasma to have lower temperature. This arrangement serves to reduce damages on wafers during plasma treatment.

It should be noted that in the present application, the term "VHF" is defined as a term referring to a range of approximately 60 MHz to 300 MHz, and the term "LF" is defined as a term referring to a range of approximately 0.45 MHz to 13 MHz. Further, the term "HF" is defined as a term referring to a range of approximately 40 MHz to 60 MHz.

A plasma deposition apparatus utilizing VHF radio frequency power may be configured to have a parallel-plate chamber structure, which serves to reduce a gap between the stage on which a wafer is placed and the ceiling of a process chamber.

Against the above-noted background, there may be a need to efficiently supply VHF radio frequency power.

RELATED-ART DOCUMENTS

Patent Document

[Patent Document 1] Japanese Patent Application Publication No. 2012-216525
[Patent Document 2] Japanese Patent Application Publication No. 2011-166740
[Patent Document 3] Japanese Patent Application Publication No. 2017-5345
[Patent Document 4] Japanese Patent Application Publication No. 2009-230915

SUMMARY OF THE INVENTION

According to an embodiment, an antenna includes a first waveguide configured to guide VHF radio frequency waves, and a second waveguide configured to guide the VHF radio frequency waves supplied from the first waveguide, the second waveguide having a pair of metal reflective plates therein facing each other across a longitudinal distance along the second waveguide, wherein a tip end of the first waveguide is coupled to the second waveguide at a sideways point thereof between the metal reflective plates, and wherein a distance between the metal reflective plates is $\lambda g/4 + \lambda g \cdot n/2$, $\lambda g$ being a wavelength of the VHF radio frequency waves in tube, and n being an integer greater than or equal to zero.

According to at least one embodiment, VHF high-frequency power may be efficiently supplied.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments for carrying out the invention will be described by referring to the accompanying drawings. In the specification and drawings, elements having substantially the same configurations are referred to by the same numerals, and a duplicate description thereof will be omitted.

[Plasma Deposition Apparatus]

Figure 1:
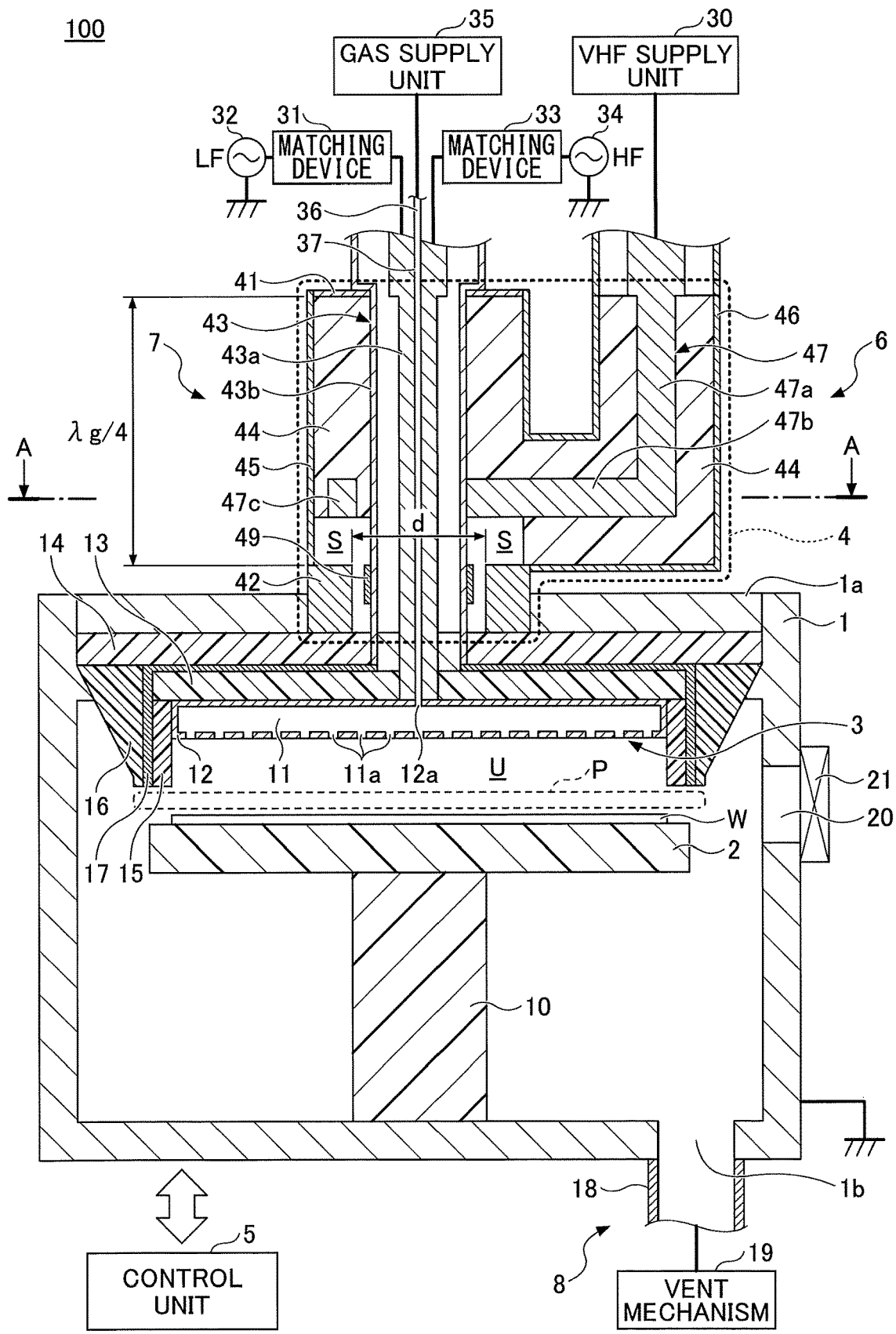
FIG. 1 is a schematic cross-sectional view illustrating an example of a plasma deposition apparatus according to an embodiment.

In the following, an example of a plasma deposition apparatus 100 according to an embodiment will be described by referring to FIG. 1. FIG. 1 is a schematic cross-sectional view illustrating an example of the plasma deposition apparatus 100 according to the embodiment. The plasma deposition apparatus 100 includes a process container 1, a stage 2, a gas showerhead 3, an antenna 4, and a control unit 5.

The process container 1 is a cylindrical shape. The process container 1, which is made of a metal such as aluminum, is coupled to the ground. The process container 1 has an open top, which is closed by a ceiling plate 1a and an antenna 4. The ceiling plate 1a is made of a metal such as aluminum. The sidewall of the process container 1 has a loading port 20 formed therethrough for loading or unloading a wafer W. A gate valve 21 is provided to close and open the loading port 20.

The stage 2 holds a semiconductor wafer (hereinafter referred to as a wafer W) in a horizontal position, which is an example of an object to be processed in the process container 1. The stage 2, which is a disk shape corresponding in size to the wafer W, is supported by a support member 10. The stage 2 and the support member 10 are made of a dielectric material such as alumina ($Al_2O_3$).

The gas showerhead 3 is provided at the ceiling part of the process container 1. The gas showerhead 3, which is made of a metal such as aluminum, is positioned to face the stage 2. The gas showerhead 3 has a shower plate 12. The shower plate 12 has a gas dispersing space 11 inside thereof, and also has a plurality of gas supply holes 11a connected to the gas dispersing space 11. A gas inlet hole 12a is formed at the top center of the shower plate 12.

The gas showerhead 3 is situated under the ceiling plate 1a to face the stage 2. The gas showerhead 3 is configured such that process gas transmitted from a gas supply unit 35 passes through a gas supply pipe 36 and a gas supply pathway 37 to enter the gas dispersing space 11 through the gas inlet hole 12a, and is then introduced into the inner space of the process container 1 through the gas supply holes 11a.

An annular member 15 is provided around the perimeter of the shower plate 12 to project downward inside the inner space of the process container 1. A cover member 16 is provided around the annular member 15 with a metal member 17 placed therebetween. The tips of the cover member 16 and the metal member 17 projecting downward are situated at the same height as the tip of the annular member 15.

The annular member 15 and the cover member 16 are made of a dielectric material such as alumina. The metal member 17, which is a cylindrical shape with an open bottom, is made of a metal such as aluminum. The metal member 17 surrounds the shower plate 12. The annular member 15 is situated at the side of the shower plate 12 between the metal member 17 and the shower plate 12, and a dielectric member is situated on the top of the shower plate 12 between the metal member 17 and the shower plate 12. The dielectric member 13, which is made of a dielectric material such as quartz, is a disk shape having a through hole at the center. This arrangement ensures that the metal member 17 and the shower plate 12 are not electrically coupled to each other.

A dielectric member 14 is provided on the top of the metal member 17 between the metal member 17 and the ceiling plate 1a of the process container 1. The dielectric member 14, which is made of a dielectric material such as quartz, is a disk shape having a through hole at the center. The cover member 16 is situated between the metal member 17 and an upper sidewall of the process container 1. The cover member 16 is a ring shape. This arrangement ensures that the metal member 17 and the process container 1 are not electrically coupled to each other.

The antenna 4 is situated over the ceiling plate 1a of the process container 1. The antenna 4 includes a first feed part 6 and a second feed part 7. The first feed part 6 includes a feed rod 47. The feed rod 47 is coupled to a VHF supply unit 30. The VHF supply unit 30 transmits VHF electromagnetic waves having a frequency in a range of 30 MHz to 300 MHz.

The first feed part 6 allows the VHF electromagnetic waves transmitted from the VHF supply unit 30 to propagate through the feed rod 47 to feed VHF radio frequency power. The feed rod 47 is a letter-L shape having a vertical portion 47a and a horizontal portion 47b. The horizontal portion 47b is connected to a coaxial waveguide 43 of the second feed part 7 at a right angle.

The feed rod 47 is made of a metal such as aluminum. The feed rod 47 is covered with a dielectric material 44 such as Teflon (registered trademark). The surface of the dielectric material 44 is covered with a metal protective member 46. The feed rod 47 which is an letter-L shape has the horizontal portion 47b that has one end connected to the vertical portion 47a and the other end connected at a right angle to a side portion of an outer conductor 43b of the second feed part 7. The feed rod 47 is coupled to the VHF supply unit 30. The VHF supply unit 30 transmits electromagnetic waves having a frequency (VHF) in a range of 30 MHz to 300 MHz.

Figure 2:
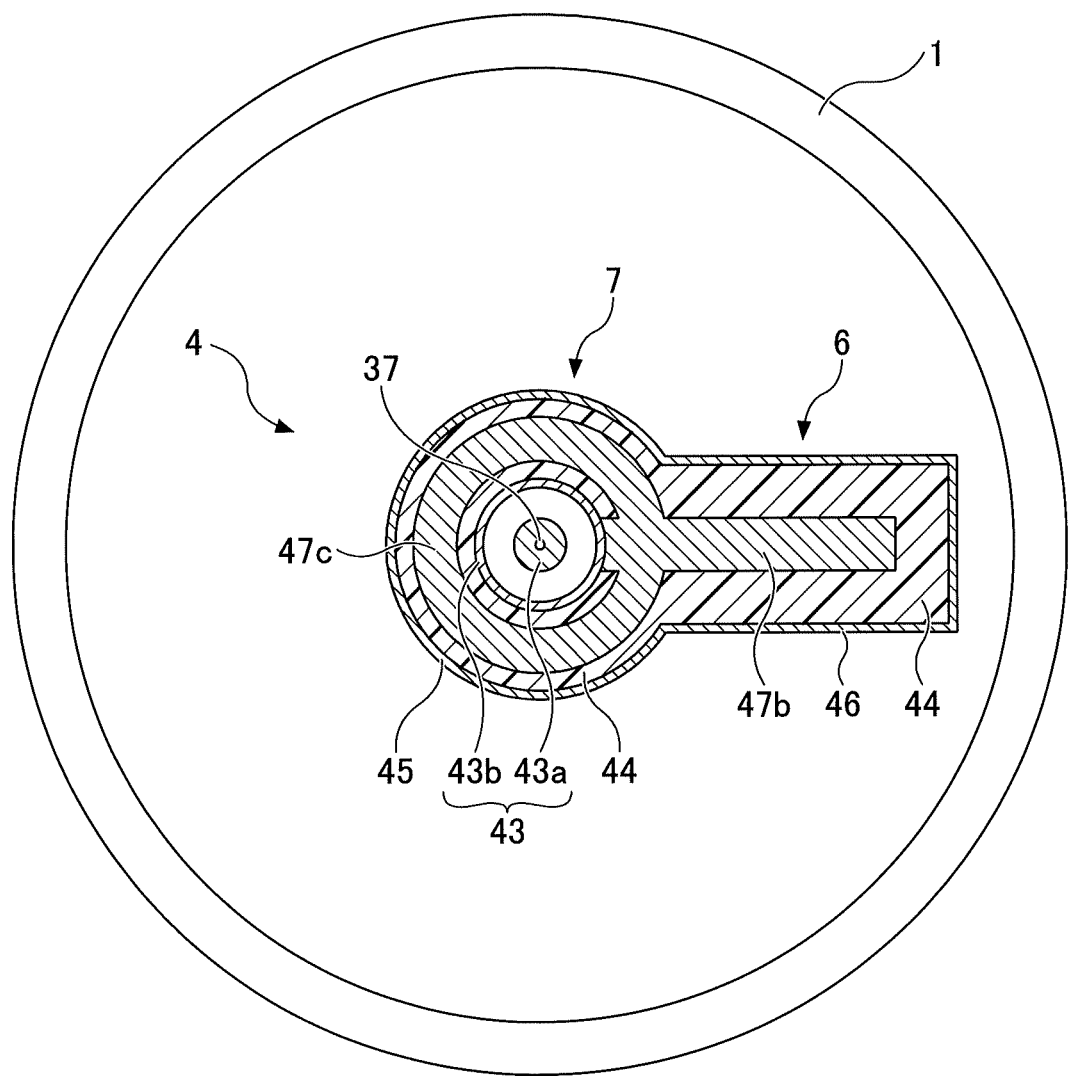
FIG. 2 is a cross-sectional view of the plasma deposition apparatus taken along the line A-A in FIG. 1.

The second feed part 7 has a coaxial waveguide 43 extending vertically. An outer surface of the coaxial waveguide 43 above a tip 47c of the feed rod 47 is covered with the dielectric material such as Teflon. A space S is formed around the coaxial waveguide 43 below the tip 47c of the feed rod 47. The surface of the dielectric material 44 is covered with a metal protective member 45. The space S is defined by the metal protective member 45. The coaxial waveguide 43 includes an inner conductor 43a and the outer conductor 43b arranged in a concentric manner, the gap between which is empty. The inner conductor 43a and the outer conductor 43b are made of a metal such as aluminum. The horizontal portion 47b of the first feed part 6 is electrically coupled to the side surface of the outer conductor 43b. As illustrated in FIG. 2, which shows a cross-section taken along the line A-A in FIG. 1, the tip 47c of the first feed part 6 is formed into a ring shape around the outer conductor 43b such as to be concentric with the outer conductor 43b and the inner conductor 43a.

Referring to FIG. 1 again, the inner conductor 43a is coupled to a radio frequency (LF) power source 32 via a matching device 31. The inner conductor 43a is also coupled to a radio frequency (HF) power source 34 via a matching device 33. The matching device 31 serves to match the load impedance with the internal impedance of the radio frequency power source 32. The matching device 33 serves to match the load impedance with the internal impedance of the radio frequency (HF) power source 34.

The radio frequency power source 32 transmits an LF radio frequency signal in the frequency range of 0.45 MHz to 13 MHz. The radio frequency power source 32 may transmit a radio frequency signal having a frequency of 0.45 MHz, 2 MHz, or 13 MHz, for example. The radio frequency power source 34, transmits an HF radio frequency signal in the frequency range of 40 MHz to 60 MHz. The radio frequency power source 34 may transmit a radio frequency signal having a frequency of 40 MHz or 60 MHz, for example.

In the present embodiment, an HF radio frequency signal and an HF radio frequency signal are superimposed and propagate through the inner conductor 43a. This is not a limiting example. Arrangement may be made such that an LF radio frequency signal alone propagates through the inner conductor 43a, or an HF radio frequency signal alone propagates through the inner conductor 43a.

The inner conductor 43a penetrates through the ceiling plate 1a of the process container 1 and the dielectric members 13 and 14 to abut the top center of the shower plate 12. The radio frequency signals transmitted from the radio frequency power sources 32 and 34 propagate through the inner conductor 43a and the shower plate 12 of the gas showerhead 3 to be supplied to a process space U.

The gas supply pathway 37 provided inside the inner conductor 43a is coupled to the gas inlet hole 12a penetrating through the top center of the shower plate 12 to connect the gas inlet hole 12a and the gas supply pipe 36 extending from the gas supply unit 35, thereby serving as a pathway for delivering a process gas to the gas dispersing space 11.

With the provision of the antenna 4 having the above-noted configuration, VHF electromagnetic waves transmitted from the VHF supply unit 30 propagate along the letter-L-shape path of the feed rod 47, followed by vertically propagating along the outer conductor 43b from the side contact point of the outer conductor 43b, then reaching the periphery area of the process space U through the metal member 17.

The LF and HF radio frequency signals transmitted from the radio frequency power sources 32 and 34 propagate vertically through the inner conductor 43a and pass through the gas showerhead 3, thereby reaching the center area of the process container 1. As a result, plasma P is generated based on the process gas showered from the lower face of the gas showerhead 3 into the process space U, which is formed between the gas showerhead 3 and the stage 2.

A vent unit 8 vents the inside of the process container 1. The vent unit 8 includes a vent pipe 18 connected to a vent opening 1b and a vent mechanism 19 that includes a pressure control valve, a vacuum pump, and the like coupled to the vent pipe 18. For the process operation, the gas inside the gas dispersing space 11 is vented by the vent mechanism 19 through the side and lower space of the stage 2 and through the vent pipe 18.

The control unit 5, which may be a computer, includes a CPU (central processing unit), a RAM (random access memory), a ROM (read only memory), an auxiliary memory device, etc. The CPU operates based on programs stored in the ROM or the auxiliary memory device to control the operations of the plasma deposition apparatus 100. The control unit 5 may be provided inside the plasma deposition apparatus 100, or may alternatively be provided outside the plasma deposition apparatus 100. When the control unit 5 is situated outside the plasma deposition apparatus 100, the control unit 5 may control the plasma deposition apparatus 100 through a wireless or wired communication means.

[Antenna]

In the following, the configuration of the antenna 4 will be described in detail by referring to FIG. 1 and FIG. 2. As illustrated in FIG. 2, the tip 47c of the first feed part 6 is formed to be a ring shape. As illustrated in FIG. 1, the coaxial waveguide 43 of the second feed part 7 penetrates through the tip 47c of the first feed part 6.

The antenna 4 causes VHF electromagnetic waves to propagate through the tip 47c of the first feed part 6 and the outer conductor 43b of the second feed part 7 to pass the space S under the tip 47c illustrated in FIG. 1 and then to propagate through the metal member 17. This arrangement allows the VHF radio frequency power to be fed into the inside of the process container 1. The antenna 4 also causes the LF and HF radio frequency signals to propagate through the inner conductor 43a of the second feed part 7. This arrangement allows the LF and HF radio frequency power to be fed into the inside of the process container 1.

The second feed part 7 has a metal reflective plate 41 at the upper end, and has a metal reflective plate 42 and a metal reflective plate 49 at the lower end. The metal reflective plates 41, 42, and 49 are ring-shaped members made of a metal such as aluminum. The coaxial waveguide 43 penetrates through the metal reflective plate 41 above the position of the tip 47c, and penetrates through the metal reflective plates 42 and 49 below the position of the tip 47c.

Each of the first feed part 6 and the second feed part 7 is a waveguide, which allows electromagnetic waves to propagate between an inner conductor and an outer conductor in this example. The inner conductor and outer conductor of the first feed part 6 are the feed rod 47 and the metal protective member 46, respectively. The second feed part 7 has an inner conductor, a middle conductor, and an outer conductor that are formed in a concentric shape. The inner conductor 43a and the outer conductor 43b are configured to allow the LF and HF radio frequency waves to propagate therebetween. The outer conductor 43b and the metal protective member 45, which serve for the VHF radio frequency waves as an inner conductor and an outer conductor, respectively, are configured to allow the VHF radio frequency waves to propagate therebetween.

The distance between the metal reflective plate 41 and the metal reflective plates 42 and 49 is designed to be equal to $\lambda g/4$. Here, $\lambda g$ is the wavelength of the VHF electromagnetic waves in tube. The distance between the metal reflective plate 41 and the metal reflective plates 42 and 49 is not limited to this example, and may be a length ($\lambda g/4+\Delta$) that is slightly longer or shorter than $\lambda g/4$, or may be $\lambda g/4+\lambda g\cdot n/2$ (n: integer greater than or equal to zero). For the purpose of making the antenna 4 small, the distance between the metal reflective plate 41 and the metal reflective plates 42 and 49 is preferably set equal to $\lambda g/4$.

With the antenna 4 having the configuration described above, the VHF electromagnetic waves having propagated the feed rod of the first feed part 6 are reflected, and resonate, between the metal reflective plate 41 and the metal reflective plates 42 and 49 placed at the opposite ends of the second feed part 7. The length of the coaxial waveguide 43 is set such that the VHF waves propagate while resonating to strengthen each other to the greatest extent.

This arrangement allows strong VHF electromagnetic waves to be supplied to the inside of the process container 1. Moreover, the LF and HF radio frequency waves in the frequency bands lower than the VHF frequency band do not resonate between the metal reflective plate 41 and the metal reflective plates 42 and 49, and, thus, attenuate while propagating inside the second feed part 7. The attenuation of the LF and HF radio frequency signals prevents the LF and HF radio frequency signals from entering the feed rod 47 of the first feed part 6 which serves as the propagation path for the VHF electromagnetic waves. As a result, the VHF power source provided in the VHF supply unit 30 is protected from damage or failure caused by the influx of LF and HF radio frequency signals. This arrangement ensures that the VHF electromagnetic waves are safely superimposed on the LF and HF radio frequency signals to be supplied to the inside of the process container 1, without providing either an LF filter circuit or an HF filter circuit in the antenna 4. The absence of an LF filter circuit and an HF filter circuit in the antenna 4 allows the antenna 4 to be designed to be small.

As was described heretofore, the antenna 4 of the present embodiment serves as a filtering antenna that cuts radio frequencies different from the main frequency so as to avoid interference from the LF and HF radio frequencies having frequencies different from that of the main VHF electromagnetic waves. With this arrangement, the antenna 4 of the present embodiment does not need a filter for avoiding interference from radio frequencies different from the frequency of the main VHF band, which serves to reduce the number of components to be used. The antenna 4 is thus made small, which results in cost reduction.

The antenna 4 of the present embodiment may be designed such that an inner diameter d of the metal reflective plate 42 illustrated in FIG. 1 is smaller than or equal to $\lambda_0/10$. Here, $\lambda_0$ is the wavelength of the VHF incoming power frequency in air.

The length of the gap between the metal reflective plate 42 and the metal reflective plate 49 in the radial direction is smaller than the width of the space S in the radial direction above the metal reflective plates 42 and 49. This arrangement serves to reduce the distortion of electromagnetic waves when the VHF electromagnetic waves pass between the metal reflective plates 42 and 49.

The antenna 4 of the present embodiment is configured such that the VHF electromagnetic waves propagate to the outer conductor 43b from the sideways point. As a result, the VHF electromagnetic waves are not formed as concentric waves relative to the center axis of the coaxial waveguide 43 when the waves propagate to the outer conductor 43b from the sideways point, resulting in being in an eccentric state while propagating vertically on the outer conductor 43b.

The metal reflective plates 42 and 49 are used to narrow the space, such that the length of the gap in the radial direction between the metal reflective plate 42 and the metal reflective plate 49 is smaller than the width of the space S in the radial direction above the metal reflective plates 42 and 49. This arrangement serves to make the VHF electromagnetic waves into concentric waves around the center axis of the coaxial waveguide 43 when the waves propagate through the gap between the metal reflective plate 42 and the metal reflective plate 49.

In the manner described above, the distortion of the VHF electromagnetic waves propagating from the sideways point is removed, which allows the VHF electromagnetic waves to propagate in a ring shape. As a result, TEM electromagnetic waves are supplied to the inside of the process container 1, and, also, higher-mode electromagnetic waves are removed from the propagating VHF electromagnetic waves.

The plasma deposition apparatus 100 having the antenna 4 of the present embodiment utilizes VHF radio frequency power having a lower frequency and a longer wavelength than microwaves and having a higher frequency and a shorter wavelength than the HF radio frequencies to produce plasma from a gas. With this arrangement, high-density plasma is generated. As a result, lower ion temperature and lower electron temperature are achieved, thereby providing a process that incurs less damage on the wafer W.

The plasma deposition apparatus 100 of the present embodiment may be configured such that the gas showerhead 3 is mountable to the antenna 4 of the present embodiment. This arrangement allows the gas showerhead 3 and the stage 2 to be placed to face each other. Further, the provision of low ion temperature and low electron temperature allows homogeneous plasma to be generated even when the gap between the gas showerhead 3 and the stage 2 is shortened, which enables an efficient, homogeneous treatment that incurs less damage on the wafer W.

[First Variation]

Figure 3:
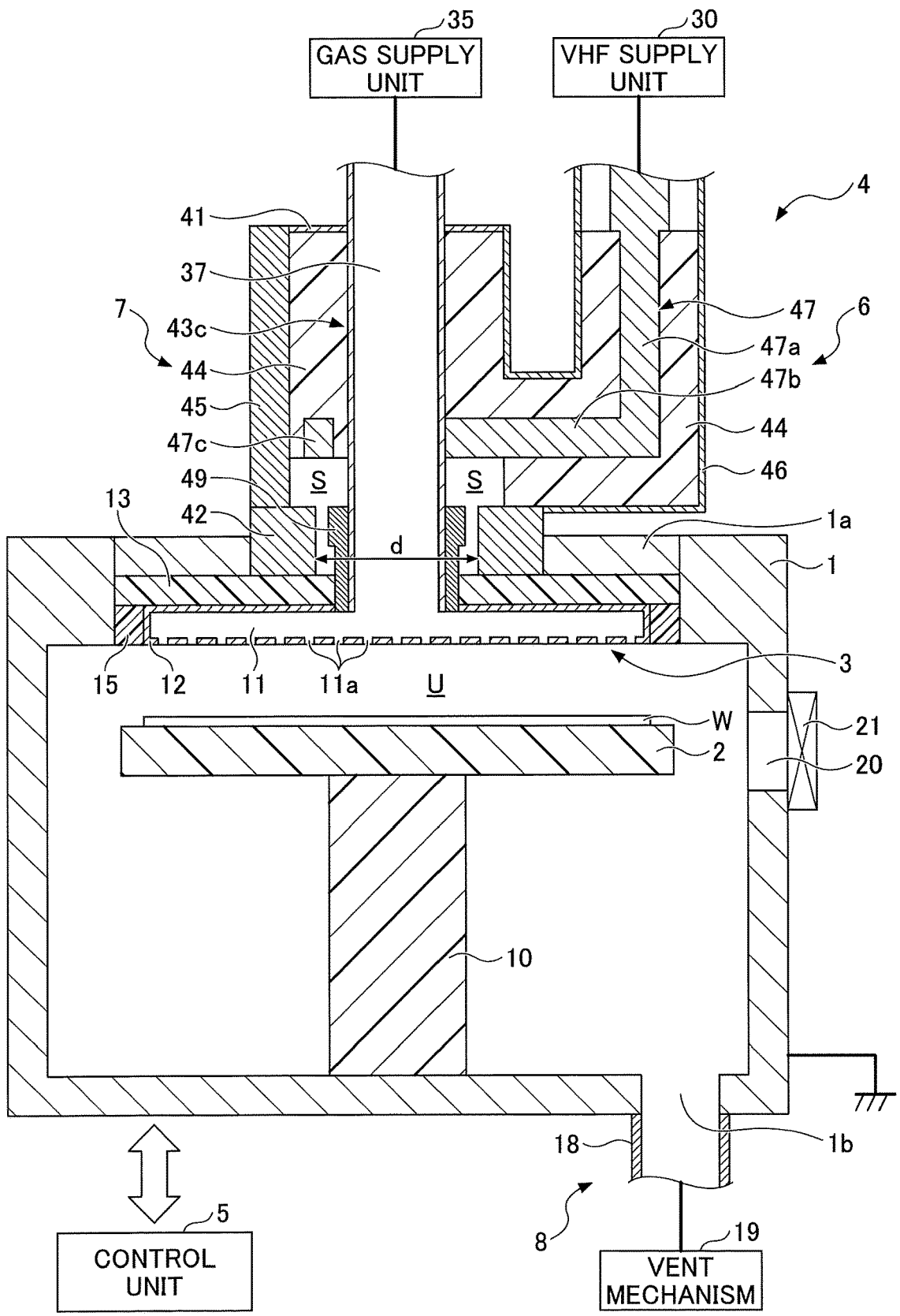
FIG. 3 is a schematic cross-sectional view illustrating an example of the plasma deposition apparatus according to a first variation of the embodiment.

In the following, a description will be given of an example of the plasma deposition apparatus 100 according to a first variation of the present embodiment by referring to FIG. 3. FIG. 3 is a schematic cross-sectional view illustrating an example of the plasma deposition apparatus 100 according to the first variation of the embodiment.

The plasma deposition apparatus 100 according to the first variation of the present embodiment differs from the plasma deposition apparatus 100 illustrated in FIG. 1 in the peripheral configuration of the antenna 4 and the gas showerhead 3. In the following, a description will be given of the peripheral configuration of the antenna 4 and the gas showerhead 3 of the plasma deposition apparatus 100 according to the first variation of the present embodiment, and a description of other parts will be omitted as appropriate.

The plasma deposition apparatus 100 of the first variation does not feed LF and HF radio frequency power. The second feed part 7 includes a hollow inner conductor 43c forming a cylindrical conductor, which serves as an inner conductor of a coaxial waveguide. The hollow inner conductor 43c is made of a metal such as aluminum. The feed rod 47 of the first feed part 6 is connected to the side of the hollow inner conductor 43c at a right angle.

In this first variation also, the distance between the metal reflective plate 41 and the metal reflective plates 42 and 49 is $\lambda g/4 + \lambda g \cdot n/2$. Here, $\lambda g$ is the wavelength of VHF electromagnetic waves in tube, and n is an integer greater than or equal to zero. With this arrangement, the VHF electromagnetic waves having propagated along the feed rod 47 propagates between the hollow inner conductor 43c and the metal protective member 45, and are reflected between the metal reflective plate 41 and the metal reflective plates 42 and 49 at the opposite ends thereof, thereby resonating to strengthen each other while propagating. This arrangement allows strong VHF electromagnetic waves to be supplied to the inside of the process container 1.

The gas supply pathway 37 is formed inside the hollow inner conductor 43c. A process gas supplied from the gas supply unit 35 passes through the gas supply pathway 37 inside the hollow inner conductor 43c to be introduced into the inner space of the process container 1 through the gas dispersing space 11 and the gas supply holes 11a of the gas showerhead 3. The annular member 15 is provided at the periphery of the shower plate 12. The dielectric member 13 is provided on the top of the gas showerhead 3. The annular member 15 is flush with the lower surface of the gas showerhead 3.

The plasma deposition apparatus 100 having the antenna 4 of the first variation generates plasma from a gas by use of VHF radio frequency power to produce a high-density plasma, similarly to the plasma deposition apparatus 100 having the antenna 4 illustrated in FIG. 1. As a result, lower ion temperature and lower electron temperature are achieved, thereby providing a process that incurs less damage on the wafer W.

The plasma deposition apparatus 100 of the first variation may be configured such that the gas showerhead 3 is mountable to the antenna 4 of the first variation. This arrangement allows the gas showerhead 3 and the stage 2 to be placed to face each other. Further, the provision of low ion temperature and low electron temperature allows homogeneous plasma to be generated even when the gap between the gas showerhead 3 and the stage 2 is shortened, which enables an efficient, homogeneous treatment that incurs less damage on the wafer W.

In the plasma deposition apparatus 100 and the antenna 4 according to the first variation, VHF energy propagates from the sideway point of the hollow inner conductor 43c to the periphery of the hollow inner conductor 43c, and a process gas is introduced into the inner space of the process container 1 from the inside of the hollow inner conductor 43c situated immediately above the gas showerhead 3. The VHF supply path and the gas supply path are thus completely separated from each other. With this arrangement, abnormal electrical discharge is avoided.

[Second Variation]

Figure 4:
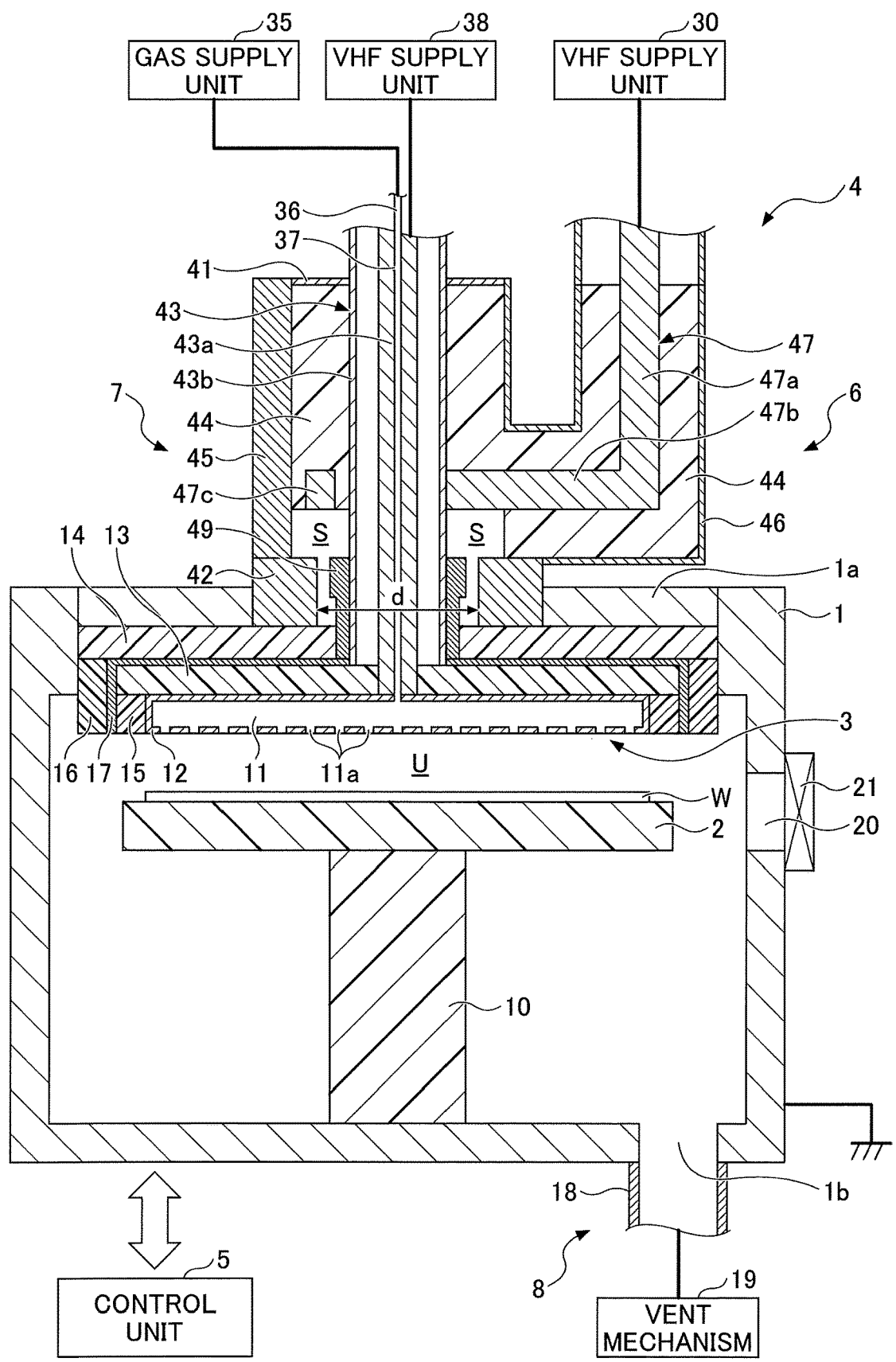
FIG. 4 is a schematic cross-sectional view illustrating an example of the plasma deposition apparatus according to a second variation of the embodiment.

In the following, a description will be given of an example of the plasma deposition apparatus 100 according to a second variation of the present embodiment by referring to FIG. 4. FIG. 4 is a schematic cross-sectional view illustrating an example of the plasma deposition apparatus 100 according to the second variation of the embodiment.

The plasma deposition apparatus 100 according to the second variation of the present embodiment differs from the plasma deposition apparatus 100 illustrated in FIG. 1 in the peripheral configuration of the antenna 4 and the gas showerhead 3. In the following, a description will be given of the peripheral configuration of the antenna 4 and the gas showerhead 3 of the plasma deposition apparatus 100 according to the second variation of the present embodiment, and a description of other parts will be omitted as appropriate.

The plasma deposition apparatus 100 and the antenna 4 of the second variation do not feed LF and HF radio frequency power. The antenna 4 of the second variation includes a VHF supply unit 38 provided separately from the VHF supply unit 30. The electromagnetic waves output from the VHF supply unit 38 propagate along the inner conductor 43a of the second feed part 7. With respect to the antenna of the second variation, the configuration that causes VHF electromagnetic waves to propagate along the outer conductor 43b of the second feed part 7 is the same as in the antenna 4 illustrated in FIG. 1. In the plasma deposition apparatus 100 of the second variation, the annular member 15 is flush with the lower face of the gas showerhead 3. The cover member 16 is situated around the annular member 15 with the metal member 17 intervening therebetween. The cover member 16 and the metal member 17 are also flush with the lower face of the gas showerhead 3.

In this second variation also, the distance between the metal reflective plate 41 and the metal reflective plates 42 and 49 is λg/4+λg/4. Here, λg is the wavelength of VHF electromagnetic waves in tube, and n is an integer greater than or equal to zero. With this arrangement, the VHF electromagnetic waves having propagated along the feed rod 47 propagates along the outer conductor 43b, and are reflected between the metal reflective plate 41 and the metal reflective plates 42 and 49 at the opposite ends thereof, thereby resonating to strengthen each other while propagating. This arrangement allows strong VHF electromagnetic waves to be supplied to the inside of the process container 1.

The plasma deposition apparatus 100 having the antenna 4 of the first variation generates plasma from a gas by use of VHF radio frequency power to produce a high-density plasma, similarly to the plasma deposition apparatus 100 having the antenna 4 illustrated in FIG. 2. As a result, lower ion temperature and lower electron temperature are achieved. A homogeneous treatment that incurs less damage on the wafer W is efficiently performed even when the gap is shortened between the gas showerhead 3 and the stage 2.

The plasma deposition apparatus 100 and the antenna 4 of the second variation feed VHF energy separately from the feeding of VHF energy that is performed by supplying the VHF radio frequency power output from the VHF supply unit 30 to the periphery area of the process container 1 through the outer conductor 43b and the metal member 17. For this separate VHF feeding, the VHF radio frequency power output from the VHF supply unit 38 is supplied to the center area of the process container 1 through the inner conductor 43a and the shower plate 12 of the gas showerhead 3. In this manner, two VHF feeding paths are provided with respect to the periphery area and the center area, thereby enabling the control of plasma distribution in the process space U. Plasma homogeneity is thus adjustable.

As has been described heretofore, the plasma deposition apparatus 100 and the antenna 4 according to the present embodiment, the first variation, and the second variation can efficiently supply VHF radio frequency power.

The plasma deposition apparatus 100 according to the present embodiment, the first variation, and the second variation has been described as having one antenna 4. This is not a limiting example. A plurality of antennas 4 may be provided to feed radio frequency power such as VHF radio frequency power from a plurality of locations.

Although an antenna and a plasma deposition apparatus have heretofore been described with reference to the embodiments, the antenna and the plasma deposition apparatus according to the present invention are not limited to such embodiments, and various modifications and improvements may be made without departing from the scope of the invention. Elements described in connection with these embodiments may be combined with each other as long as consistency is maintained.

The disclosed plasma deposition apparatus is applicable to any one of the following types: capacitively coupled plasma (CCP), inductively coupled plasma (ICP), a radial line slot antenna, an electron cyclotron resonance plasma (ECR), and a helicon wave plasma (HWP).

A semiconductor wafer W has been used as an example of an object to be processed. The object to be processed is not limited to this example, and may alternatively be a printed board, a CD substrate, various types of substrates for use in an LCD (liquid crystal display) or an FPD (flat panel display), etc.

The present application is based on and claims priority to Japanese patent application No. 2017-237917 filed on Dec. 12, 2017, with the Japanese Patent Office, the entire contents of which are hereby incorporated by reference.

What is claimed is:

1. An antenna, comprising
a first waveguide configured to guide VHF radio frequency waves; and
a second waveguide configured to guide the VHF radio frequency waves supplied from the lint waveguide, the second waveguide having a pair of metal reflective plates therein facing each other across a longitudinal distance along the second waveguide,
wherein a tip end of the first waveguide is coupled to the second waveguide at a sideways point thereof between the metal reflective plates, and
wherein a distance between the metal reflective plates is λg/4+λg·n/2, λg being a wavelength of the VHF radio frequency waves in the second waveguide, and n being an integer greater than or equal to zero.

2. The antenna as claimed in claim 1, wherein the second waveguide is configured such that the VHF radio frequency waves resonate between the metal reflective plates.

3. The antenna as claimed in claim 1, wherein the first waveguide includes a feed rod, and the metal reflective plates and a tip end of the feed rod are a ring shape, and
wherein the second waveguide includes an inner conductor disposed therein, the inner conductor penetrating the metal reflective plates and the tip end of the feed rod.

4. The antenna as claimed in claim 1, wherein either a dielectric material or void space, or both, are situated between the metal reflective plates.

5. The antenna as claimed in claim 4, wherein a void space is provided immediately next to, and on an inner side of, one of the metal reflective plates, and the one of the metal reflective plates has a ring-shaped gap from a third metal reflective plate disposed radially inside the one of the metal reflective plates, a length of the ring-shaped gap in a radial direction being smaller than a distance between an inner conductor and an outer conductor of the second waveguide in the void space.

6. The antenna as claimed in claim 1, wherein the second waveguide includes an is conductor, a middle conductor, and an outer conductor that are formed in a concentric shape, and
wherein the outer conductor and the middle conductor are configured to allow the VHF radio frequency waves supplied from the first waveguide to propagate therebetween, and the middle conductor and the inner conductor are configured to allow LF and/or HF radio frequency waves to propagate therebetween.

7. The antenna as claimed in claim 6, wherein the inner conductor is a hollow structure configured to allow gas to flow therethrough.

8. The antenna as claimed in claim 1, wherein the second waveguide includes a hollow inner conductor and an outer conductor that serve as a coaxial waveguide, and
wherein the VHF radio frequency waves supplied from the first waveguide propagate between the outer conductor and the hollow inner conductor, and the hollow inner conductor is configured to allow gas to flow therethrough.

9. The antenna as claimed in claim 1, wherein the second waveguide includes an inner conductor, a middle conductor, and an outer conductor that are formed in a concentric shape, and
wherein the outer conductor and the middle conductor are configured to allow the VHF radio frequency waves supplied from the first waveguide to propagate therebetween, and wherein a source different from a source of the VHF radio frequency waves provides second VHF radio frequency waves, and the middle conductor and the inner conductor are configured to allow the second VHF radio frequency waves to propagate therebetween.

10. A plasma deposition apparatus, comprising:
an antenna configured to provide VHF radio frequency waves; and
a process chamber in which plasma is generated based on the VHF radio frequency waves to perform a deposition process,
wherein the antenna includes;
a first waveguide configured to guide the VHF radio frequency waves; and
a second waveguide configured to guide the VHF radio frequency waves supplied from the first waveguide, the second waveguide having a pair of metal reflective plates therein facing each other across a longitudinal distance along the second waveguide,
wherein a tip end of the first waveguide is coupled to the second waveguide at a sideways point thereof between the metal reflective plates, and
wherein a distance between the metal reflective plates is $\lambda g/4 + \lambda g \cdot n/2$, $\lambda g$ being a wavelength of the VHF radio frequency waves in the second waveguide, and n being an integer greater than or equal to zero.

11. The plasma deposition apparatus as claimed in claim 10, further comprising a gas showerhead provided at a ceiling part of the process chamber, wherein the second waveguide is coupled to the gas showerhead.

* * * * *